(12) United States Patent
Novak et al.

(10) Patent No.: US 6,977,493 B2
(45) Date of Patent: Dec. 20, 2005

(54) ELECTRICAL POWER PROBE FOR TESTING AND SUPPLYING POWER TO ELECTRICAL WIRING AND DEVICES

(75) Inventors: Patrick J. Novak, Raleigh, NC (US); Jeffrey Edward Frey, Cary, NC (US); Lynton R. Burchette, Sanford, NC (US)

(73) Assignee: Santronics, Inc., Sanford, NC (US)

( * ) Notice: Subject to any disclaimer, the term of this patent is extended or adjusted under 35 U.S.C. 154(b) by 1 day.

(21) Appl. No.: 10/798,666

(22) Filed: Mar. 11, 2004

(65) Prior Publication Data

US 2005/0200346 A1   Sep. 15, 2005

(51) Int. Cl.[7] ............................................. G01R 31/02
(52) U.S. Cl. ..................... 324/72.5; 324/133; 324/149; 324/158.1
(58) Field of Search ............................. 324/72.5, 133, 324/149, 103; 702/117–119

(56) References Cited

U.S. PATENT DOCUMENTS

| | | |
|---|---|---|
| 3,962,630 A | 6/1976 | Chaffee |
| 4,027,236 A | 5/1977 | Stewart |
| 4,205,264 A | 5/1980 | Gold |
| 4,536,705 A | 8/1985 | Hayes |
| 4,540,940 A | 9/1985 | Nolan |
| 4,764,727 A | 8/1988 | McConchie |
| 4,791,376 A | 12/1988 | Freedman |
| 5,057,770 A | 10/1991 | Kalishman |
| 5,103,165 A | 4/1992 | Sirattz |
| 5,107,387 A * | 4/1992 | Orton ........................... 361/33 |
| 5,367,250 A | 11/1994 | Whisenand |
| 5,583,801 A * | 12/1996 | Croyle et al. ............... 702/115 |
| 5,635,843 A | 6/1997 | Borland |
| 5,672,964 A | 9/1997 | Vinci |
| 5,877,618 A | 3/1999 | Luebke |
| 6,323,652 B1 | 11/2001 | Collier |
| 6,396,278 B1 | 5/2002 | Makhija |
| 6,433,530 B1 | 8/2002 | Pool |
| 6,512,361 B1 | 1/2003 | Becker |
| 6,525,665 B1 | 2/2003 | Luebke |
| 6,725,170 B1 * | 4/2004 | Hickman ..................... 702/106 |

* cited by examiner

Primary Examiner—Paresh Patel

(57) ABSTRACT

An electrical power probe is provided. In one aspect, an electrical power probe includes a power probe control unit adapted to connect to a direct current (DC) power source and receive an input source voltage from the DC power source. The power probe control unit comprises a power switch controlling the switching of the input source voltage to a cable. A power probe wand includes a conductive wand tip and a user controlled switch, with the wand tip being connected to the power switch by the cable. The power probe control unit sends a query message to the power probe wand. The power probe wand unit sends a response to the power probe control unit in response to the query message, with response indicating the position of the user controlled switch. The power probe control unit selectably switches the power switch based on the position of the user controlled switch.

19 Claims, 4 Drawing Sheets

ELECTRICAL POWER PROBE FOR TESTING AND SUPPLYING POWER TO ELECTRICAL WIRING AND DEVICES

BACKGROUND

The present invention relates generally to electrical test equipment, and more particularly to an electrical power probe for testing electrical wiring and electronics.

The testing and maintenance of automobile electrical systems and other battery powered systems is an increasingly common and important task. These automotive electrical systems are powered by a relatively low voltage direct current (DC) battery, typically a 12 volt DC battery. Newer automobile electrical systems may include voltages ranging from 6 volts up to 48 volts or more.

Various devices have been utilized to test automotive electrical systems. These devices typically are used to trouble shoot electrical systems by probing a contact point to determine if the DC voltage is present. Many of these devices suffer from various disadvantages or problems, such as inadequate safety features and the lack of desired functionality. Accordingly, the need exists for an electrical power probe which addresses the failings of these prior devices and provides an electrical power probe which is safe, easy to use and provides the functionality required in automotive or component testing environments.

SUMMARY

In accordance with an embodiment of the present invention, an electrical power probe for testing electrical equipment is provided. In one aspect of the present invention, an electrical power probe includes a power probe control unit adapted to connect to a direct current (DC) power source and receive an input source voltage from the DC power source. The power probe control unit comprises a power switch controlling the switching of the input source voltage to a cable. A power probe wand includes a conductive wand tip and a user controlled switch, with the wand tip being connected to the power switch by the cable. The power probe control unit sends a query message to the power probe wand. The power probe wand unit sends a response to the power probe control unit in response to the query message, with response indicating the position of the user controlled switch. The power probe control unit selectably switches the power switch based on the position of the user controlled switch.

A more complete understanding of the present invention, as well as further features and advantages of the invention, will be apparent from the following detailed description and the accompanying drawings.

DETAILED DESCRIPTION

The following detailed description of preferred embodiments refers to the accompanying drawings which illustrate specific embodiments of the invention. Other embodiments having different structures and operations do not depart from the scope of the present invention.

Figure 1:
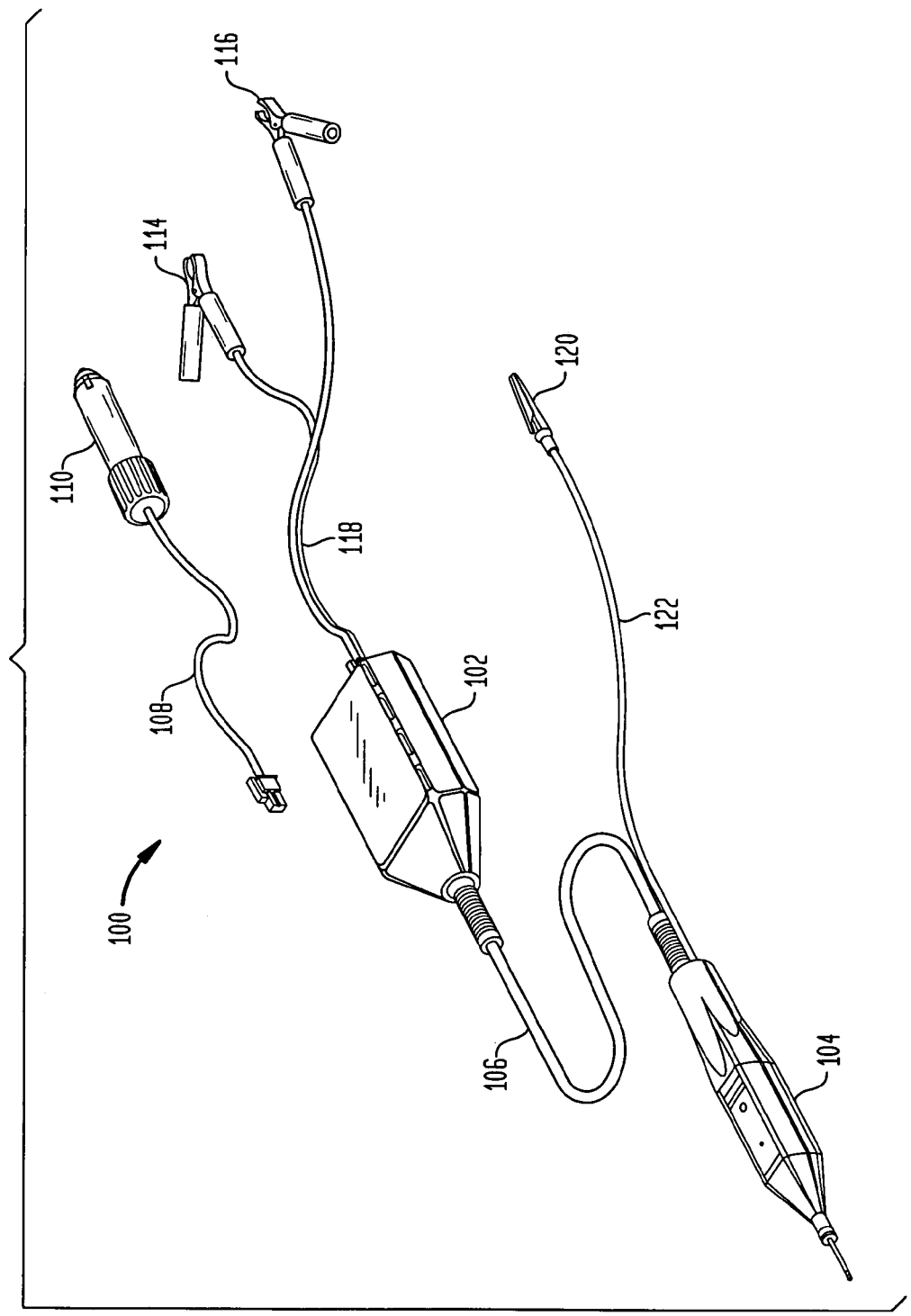
FIG. 1 shows a perspective view of an electrical power probe in accordance with the present invention.

FIG. 1 shows a perspective view of an electrical power probe 100 in accordance with the present invention. The power probe 100 is an electrical diagnostic tool for testing and trouble shooting DC systems and wiring. As described in greater detail below, the power probe 100 may be utilized to determine the connectivity of a test point to either ground or a positive battery terminal, or alternatively the electrical continuity through a wire or electronic component. The power probe 100 may also be used to supply power to an electronic device for short periods of time by providing high current paths to both the positive and negative terminals of a battery connected to the power probe 100.

The power probe 100 includes a control unit 102 connected to a wand 104 through an interface wiring cable 106. In a preferred embodiment, the wiring cable includes four wires, with two wires serving as a communications channel between the control unit 102 and the wand 104, and the other two wires serving as a ground (negative) and DC (positive) connections to an auxiliary test ground clip 120 and probe tip 124 of the wand 104. An input wiring cable 108 connects the control unit 102 to the input voltage unit 110. The input voltage unit 110 is adapted to be inserted into the cigarette lighter socket or auxiliary power outlet present in many automobiles. Alternately, alligator clips 114 and 116 attached to input wiring cable 118 may be utilized to connect the control unit 102 directly to automotive or heavy equipment battery terminals or any other suitable DC power source. Alligator clip 114 may be color coded red to indicate that the clip 114 should be attached to the positive terminal of the battery, and alligator clip 116 may be color coded black to indicate that the clip 116 should be attached to the negative terminal of the battery. Regardless of which input unit is utilized, the control unit 102 is supplied with a positive DC connection and a ground, or reference voltage, connection. The auxiliary test ground clip 120 for attaching the power probe 100 to a local ground is connected to the wand 104 by grounding cable 122. The auxiliary test ground clip 120 is particularly useful for the testing of stand alone electronic components.

Figure 2:
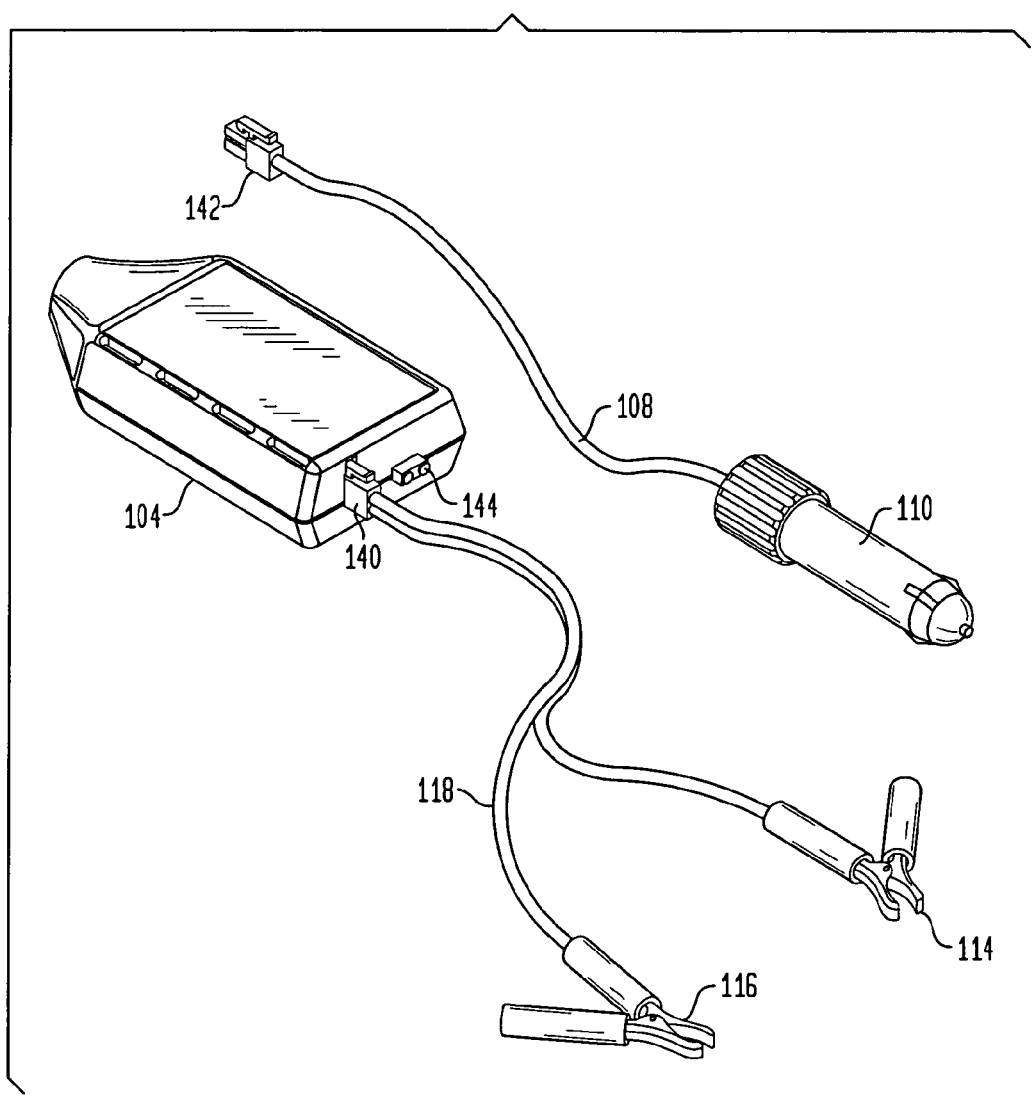
FIG. 2 shows a perspective view of an electrical power probe control unit in accordance with the present invention.

As seen more clearly in FIG. 2, the wiring cables 108 and 118 are connected to an input port on the control unit 104 through modular connectors 142 and 140, respectively. A reverse polarity protection fuse 144 is readily accessible at an end of the control unit 104. The reverse polarity protection fuse 144 will clear, or blow, disconnecting the power probe 100 from the battery if the polarity of inputs is reversed.

Figure 3:
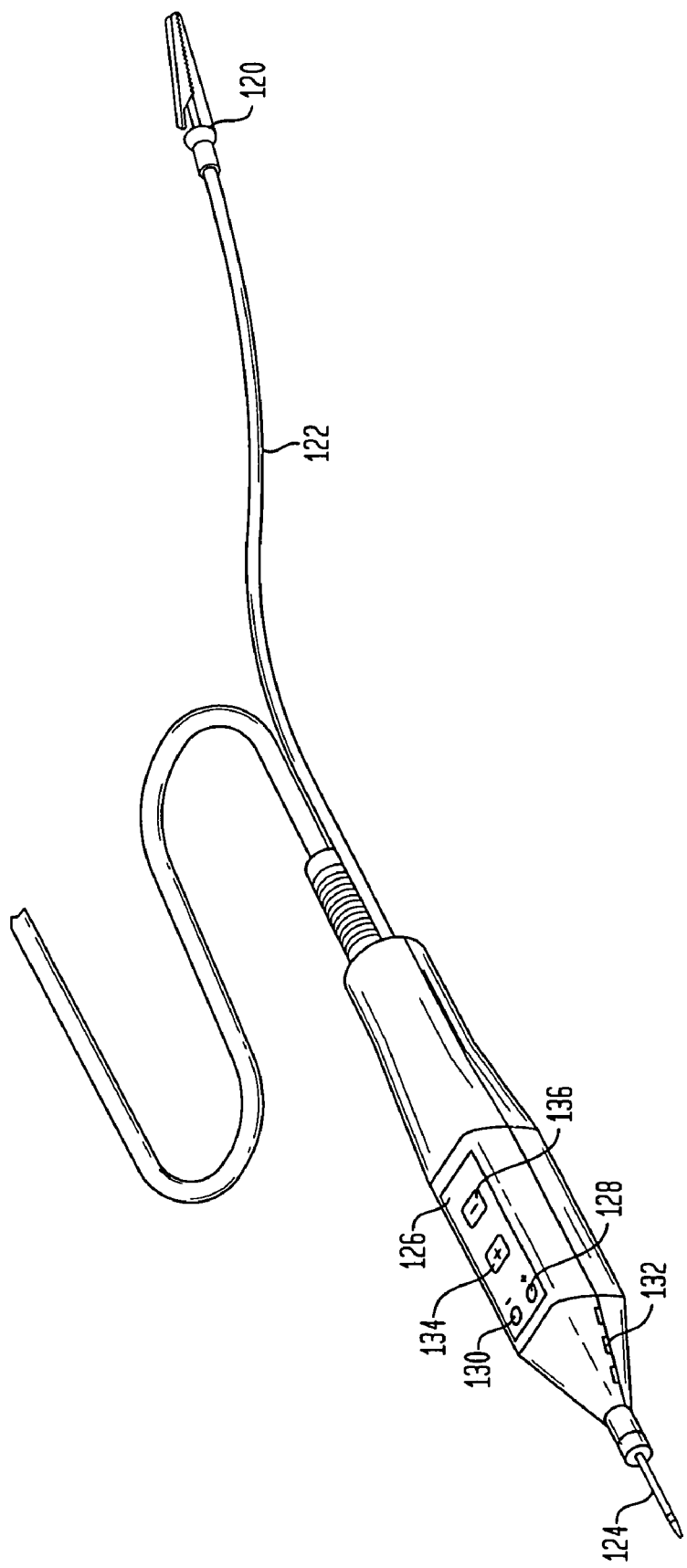
FIG. 3 shows a perspective view of an electrical power probe control wand in accordance with the present invention.

As shown in FIG. 3, the wand 104 includes the conductive probe tip 124 and a user interface panel 126. The user interface panel 126 located for ease of use by the user as the wand 104 is held and operated. The user interface panel includes a positive polarity status indicator 128 which illuminates, preferably with a red color, when the probe tip 124 is in contact with a test point which is at a potential substantially equal the positive voltage input to the control unit 104. A negative polarity status indicator 130 illuminates, preferably with a green color, when the probe tip 124 is on contact with a test point which is at a potential substantially equal to the voltage of the ground, or negative, voltage input to the control unit 104. In a preferred embodiment, the status indicators 128 and 130 comprise light emitting diodes (LEDs). A beeper may sound briefly through audio port 132 when the probe tip contacts either a positive or negative potential, providing the user with feedback that an electrical connection has been made. Such an audio indication may be especially valuable in locations that are difficult to see or reach.

In addition to testing the voltage potential of a test point contacted by the probe tip 124, the power probe 100 may be utilized to supply the probe tip 124 with an output voltage potential. This output voltage potential is substantially equal to either the positive or negative potential input to the control unit 104 from the battery. Positive pushbutton switch 134 and negative pushbutton switch 136 control the application of the output voltage. When the positive pushbutton 134 is actuated, the indicator 128 illuminates and the probe tip 124 is driven to a voltage substantially equal to the positive input potential. When the negative pushbutton 136 is actuated, the indicator 130 illuminates and the probe tip 124 is driven to a voltage substantially equal to the negative input potential. The pushbuttons 134 and 136 do not make electrical contact with the probe tip 124 or switching power transistors in the control unit 102, thus isolating the user from high currents. In a preferred embodiment, the power probe 100 is capable of operation from 6 volts through 48 volts DC and sourcing and sinking up to 10 amperes of current to and from a load.

If the capabilities of the power probe 100 are exceeded, either due to excessive current or a high operating temperature, this condition may be indicated on the user interface panel 126. For example, if there is a current overload condition, the beeper may sound through the audio port 132 and both indicator 128 and indicator 130 illuminate. Additionally, as described in greater detail below, the probe wand 104 is disconnected from the input source, thus protecting a user holding the wand 104 from exposure to extreme levels of fault current.

Figure 4:
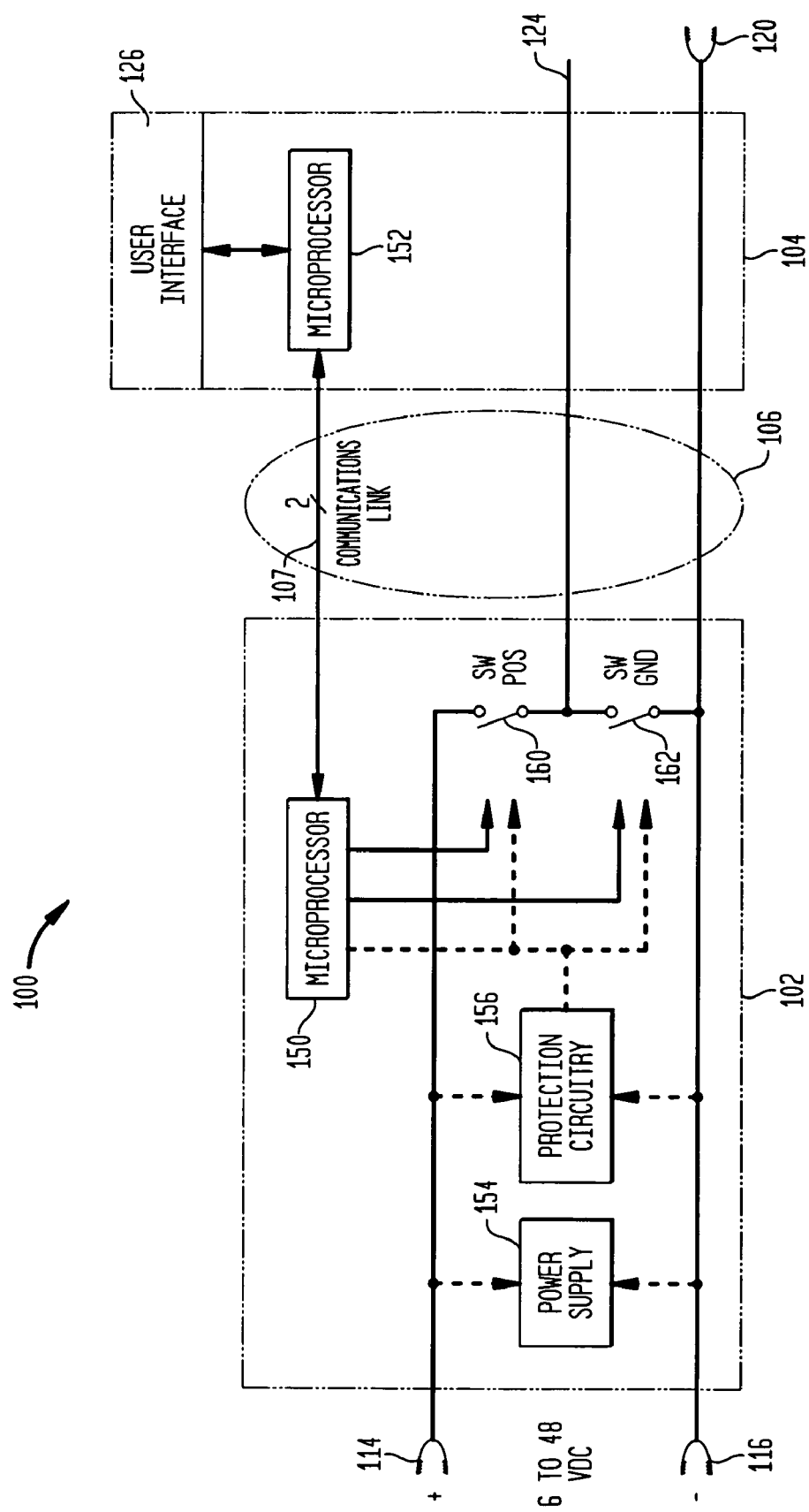
FIG. 4 shows a functional block diagram of an electrical power probe in accordance with the present invention.

FIG. 4 shows a functional block diagram of the power probe 100 in accordance with the present invention. The control unit 102 includes power supply circuitry 154, protection circuitry 156 and a microprocessor 150. The microprocessor 150 controls the operation of power switches 160 and 162. The microprocessor 150 also communicates with a microprocessor 152 in the wand 104 utilizing a communications technique described in greater detail below.

Power supply circuitry 154 provides two basic functions: input conditioning and voltage regulation. Regarding the input conditioning function, the circuitry 154 receives the input voltage from the modular connectors 140 and 142. The circuitry 154 also provides reverse polarity protection. If the polarity of the voltage inputs is reversed, the reverse polarity protection fuse 144 will clear and disconnect the power probe 100 from the battery or other power source. Additionally, the circuitry 154 limits potential voltage surges, which may be caused by an alternator of the input power source, from damaging the power probe 100. Regarding the voltage regulation function, the circuitry 154 creates the multiple voltages which are used within the control unit 102.

Protection circuitry 156 provides current limit threshold monitoring to protect the user holding the wand 104. The protection circuitry 156 limits the current passing through cable 106 to the wand 104 to a safe level, and disconnects the wand 104 from the control unit 102 if this level is exceeded. In a preferred embodiment, the current is limited to 10 amperes.

Connection between the battery terminals attached to clips 114 and 116 and the probe tip 124 is provided by the power switches 160 and 162. In a preferred embodiment, the switches 160 and 162 are high current field effect transistors (FETs) to provide for high reliability and prevent arcing, a common problem with mechanical switches which become damaged due to arcing at near rated current switching. Additionally, the switches 160 and 162 may each suitably comprise multiple FETs operating in parallel to improve thermal performance and current carrying capacity. These switches 160 and 162 are under the control of the microprocessor 150 based on the monitored actuation of the pushbutton switches 134 and 136. During normal operation, the microprocessor 152 in the wand 104 monitors the state of the pushbutton switches 134 and 136. The microprocessor 152 is then polled by the microprocessor 150 over a two wire channel 107 of the interface wiring cable 106. If the microprocessor 150 determines that the pushbutton switch 134 has been actuated, then the microprocessor 150 causes the switch 160 to close, providing the conductive probe tip 124 with a connection to the positive input voltage supplied through clip 114. If the microprocessor 150 determines that the pushbutton switch 136 has been actuated, then the microprocessor 150 causes the switch 162 to close, providing the conductive probe tip 124 with a connection to the negative input voltage, or ground, supplied through clip 116.

The pushbutton switches 134 and 136 in direct contact with the user do not carry any current supplied to probe tip 124, as these switches are only used to actuate the main switch transistors 160 and 162 through monitoring by the microprocessors 150 and 152. This isolation of the pushbutton switches 134 and 136 from the switches 160 and 162 isolates the user from the load current carrying circuit path.

As described above, the control unit 102 and the wand 104 include microprocessors 150 and 152, respectively, which interoperate in a tightly couple master and slave relationship. The purpose of the microprocessor 152 in the wand 104 is to manage the user interface 126 by checking the status the pushbuttons 134 and 136, and operate the indicators 128 and 130 and beeper. The microprocessor 150 in the control unit 102 provides the intelligence to the power probe 100, including the actual user interface functionality, by monitoring sensors and setting the power probe 100 state of operation based upon external conditions and operator input. As a part of this operation, the microprocessor 150 periodically sends commands and queries to the wand over the communications link 107 to the microprocessor 152. The microprocessor 152 responds to the commands and queries with acknowledgements and responses, respectively. If the microprocessor 152 does not respond to a command or query, due to component failure, for example, the microprocessor 150 places the power probe 100 into a safe, or off, state.

The symbols, or digital bits, of the commands, queries, acknowledgments and responses, comprise serial pulse code modulated (PCM) waveforms transmitted along the wires 107. The microprocessor 150 periodically queries the microprocessor 152 for the positions of the pushbutton switches 134 and 136, and the microprocessor 152 responds with a response indicating the positions of the pushbutton switches 134 and 136. The microprocessor 150 commands the microprocessor to turn on and off the indicators 128 and 130 and the beeper, as required. The microprocessor 152 responds back to the microprocessor 150 with an acknowledgement upon receipt of a valid command. Redundancy may be built into the PCM symbols to protect against communication channel bit errors.

As described above, the two wires 107 of the four wire cable 106 connecting the control unit 102 with the wand 104 are dedicated for interprocessor communication. One of the wires, a transmit line, is utilized to transmit commands and requests to the wand 102, and the other line, a receive line, is utilized to received acknowledgements and responses from the wand 102. When these lines are not being used for communication, these two lines are a predetermined voltage potential apart to provide the voltage potential which powers the electronics, including the microprocessor 152, in the wand 104. A capacitor in the wand is charged by this voltage to provide the electronics with power during communications. When the control unit 102 wants to communicate with the wand 104, the microprocessor 150 modulates a PCM waveform on the transmit line. When the wand 104 wants to respond back to the controller, the microprocessor 152 modulates a PCM waveform on the receive line. The duty cycle of the communications between the control unit 102 and the wand 104 is such that the capacitor does not discharge below the operating point of the electronics in the wand 104. This capacitor recharges between communication transmissions.

Although specific embodiments have been illustrated and described herein, those of ordinary skill in the art appreciate that any arrangement that is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. An electrical power probe comprising:
a power probe control unit adapted to connect to a direct current (DC) power source and receive an input source voltage from the DC power source, said power probe control unit comprising power switching circuitry controlling the switching of the input source voltage to a cable; and
a power probe wand including a conductive wand tip and a user controlled switch device, said wand tip electrically connected to the power switching circuitry through the cable,
said power probe control unit adapted to send a query message to the power probe wand,
said power probe wand adapted to send a response to the power probe control unit in response to the query message, said response indicating the position of the user controlled switch device,
said power probe control unit adapted to selectably switch the power switching circuitry based on the position of the user controlled switch device.

2. The electrical power probe of claim 1 wherein:
said power probe control unit is adapted to connect to positive and negative input source voltages of the DC power source; and
said power switching circuitry controls the switching of either the positive input source voltage or the negative input source voltage to the cable.

3. The electrical power probe of claim 2 wherein said power probe control unit further comprises a positive input terminal adapted to connect to the positive input source voltage, a negative input terminal adapted to connect to the negative input source voltage, a reverse polarity protection fuse, and reverse polarity protection circuitry adapted to clear the reverse polarity protection fuse if the positive input terminal is connected to the negative input source voltage and the negative input terminal is connected to the positive input source voltage.

4. The electrical power probe of claim 2 wherein:
said user controlled switch device comprises first and second switches;
said query message requests the position of both the first and second switches; and
said response indicates the position of both the first and second switches.

5. The electrical power probe of claim 4 wherein:
said power probe control unit switches the power switching circuitry to connect the positive input source voltage to the conductive wand tip through cable if the first switch is in an activated state; and
said power probe control unit switches the power switching circuitry to connect the negative input source voltage to the conductive wand tip through cable if the second switch is in an activated state.

6. The electrical power probe of claim 5 wherein the power probe control unit is adapted to send commands to the power probe wand, and the power probe wand is adapted to send acknowledgements to the power probe control unit in response to the commands.

7. The electrical power probe of claim 6 wherein the cable comprises a first wire for carrying queries and commands transmitted to the power probe wand, a second wire for carrying responses transmitted to the power probe control unit, and a third wire electrically connecting the power switching circuitry with the conductive tip.

8. The electrical power probe of claim 7 wherein the power probe control unit further comprises a first microprocessor controlling operation of the power probe control unit, and the power probe wand comprises a second microprocessor controlling operation of the power probe wand.

9. The electrical power probe of claim 8 wherein, when the first and second wires are not being used for communication, the power probe control unit is adapted to hold the first wire and second wires a predetermined voltage potential apart to provide operating power to the microprocessor of the power probe wand.

10. The electrical power probe of claim 1 wherein the power switching circuitry comprises solid state devices.

11. The electrical power probe of claim 10 wherein each solid state device comprises at least one high current field effect transistor.

12. The electrical power probe of claim 1 wherein the power switching circuitry is electrically isolated from a load current delivered by wand tip.

13. The electrical power probe of claim 1 wherein:
said power probe control unit is adapted to connect to positive and negative input source voltages of the DC power source; and
when the input source voltage is not switched to the cable, the power probe control unit monitors voltage potential of the wand tip through the cable and determines if the voltage potential of the wand tip is substantially equal either the positive or negative input source voltages.

14. The electrical power probe of claim 13 wherein, if the power probe control unit determines the voltage potential of the wand tip is substantially equal to the positive input source voltage, the power probe control unit is adapted to transmit a first command to the power probe wand instructing the power probe wand to illuminate a first indicator.

15. The electrical power probe of claim 14 wherein, if the power probe control unit determines the voltage potential of the wand tip is substantially equal to the negative input source voltage, the power probe control unit is adapted to transmit a second command to the power probe wand instructing the power probe wand to illuminate a second indicator.

16. A method of operating an electrical power probe comprising:
   providing a power probe control unit adapted to connect to a direct current (DC) power source and receive an input source voltage from the DC power source, said power probe control unit comprising power switching circuitry controlling the switching of the input source voltage to a cable;
   providing a power probe wand including a conductive wand tip and a user controlled switch device, said wand tip electrically connected to the power switching circuitry through the cable;
   sending a query message to the power probe wand from the power probe control unit, said query message instructing the power probe wand to report the state of the user controlled switch device;
   sending a response message to the power probe control unit from the power probe wand, said response indicating the state of the user controlled switch device; and
   switching, by the power probe control unit, the power switching circuitry based on the state of the user controlled switch.

17. The method of claim 16 wherein the power probe control unit comprises a positive input terminal and a negative input terminal, the user controlled switch device comprises first and second switches, and the response message indicates the position of the first and second switches, the method further comprising:
   attaching the positive input terminal to a positive source voltage;
   attaching the negative input terminal to a negative source voltage;
   switching the positive source voltage to the cable if the first switch is activated; and
   switching the negative source voltage to the cable if the second switch is activated.

18. The method of claim 17 wherein the power probe control unit comprises reverse polarity protection circuitry and a reverse polarity protection fuse, the method further comprising:
   clearing the reverse polarity protection fuse by the reverse polarity protection circuitry if the positive input terminal is attached to the negative source voltage and the negative input terminal is attached to the positive source voltage.

19. The method of claim 17 further comprising:
   sending a command message from the power probe control unit to the power probe wand.

* * * * *